(12) United States Patent
Yen et al.

(10) Patent No.: US 8,703,524 B1
(45) Date of Patent: Apr. 22, 2014

(54) INDIUM SPUTTERING METHOD AND MATERIALS FOR CHALCOPYRITE-BASED MATERIAL USABLE AS SOLAR CELL ABSORBER LAYERS

(71) Applicant: TSMC Solar Ltd., Taichung (TW)

(72) Inventors: Wen-Tsai Yen, Caotun Township (TW); Chung-Hsien Wu, Luzhu Township (TW); Shih-Wei Chen, Kaohsiung (TW); Wen-Chin Lee, Baoshan Township (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 13/689,091

(22) Filed: Nov. 29, 2012

(51) Int. Cl.
*H01L 21/00* (2006.01)
(52) U.S. Cl.
USPC .................. 438/84; 438/102; 257/E21.07
(58) Field of Classification Search
USPC .............. 257/E21.069, E21.07, E21.071, 257/E21.072, E21.073
See application file for complete search history.

(56) References Cited

U.S. PATENT DOCUMENTS

2010/0200050 A1* 8/2010 Aksu et al. ............... 136/252

OTHER PUBLICATIONS

U.S. Appl. No. 13/677,361, filed Nov. 15, 2012.

* cited by examiner

*Primary Examiner* — Cheung Lee
(74) *Attorney, Agent, or Firm* — Duane Morris LLP

(57) ABSTRACT

A solar cell includes an absorber layer formed of a CIGAS, copper, indium, gallium, aluminum, and selenium. A method for forming the absorber layer provides for using an indium-aluminum target and depositing an aluminum-indium film as a metal precursor layer using sputter deposition. Additional metal precursor layers such as a CuGa layer are also provided and a thermal processing operation causes the selenization of the metal precursor layers. The thermal processing operation/selenization operation converts the metal precursor layers to an absorber layer. In some embodiments, the absorber layer includes a double graded chalcopyrite-based bandgap.

10 Claims, 3 Drawing Sheets

INDIUM SPUTTERING METHOD AND MATERIALS FOR CHALCOPYRITE-BASED MATERIAL USABLE AS SOLAR CELL ABSORBER LAYERS

TECHNICAL FIELD

The disclosure relates to solar cells and methods and systems for forming absorber layers in solar cells.

BACKGROUND OF THE DISCLOSURE

Solar cells are photovoltaic components for direct generation of electrical current from sunlight. Due to the growing demand for clean sources of energy, the manufacture of solar cells has expanded dramatically in recent years and continues to expand. Various types of solar cells exist and continue to be developed. Solar cells include absorber layers that absorb the sunlight that is converted into electrical current. The quality and performance of the absorber layer are therefore of paramount importance. The composition of the absorber layer and the structure of the absorber layer are of critical importance in order to maximize the efficiency of electrical current production. The formation of the absorber layer and its placement on the solar cell substrate are therefore also critical operations.

One particularly popular type of absorber material is a CIGS-based absorber material. CIGS—copper indium gallium selenide, $Cu(In,Ga)Se_2$—is a popular chalcogenide semiconductor material and CIGS-based materials find use in various applications but are particularly useful as absorber layers in solar cells. In order to create a CIGS-based material, an indium, In, material must be formed on the solar cell substrate. The formation of the indium material is most commonly and most often accomplished by sputtering indium from an indium sputtering target onto the substrate. Other processing operations are of course used to form the other materials of the CIGS-based absorber layer. A shortcoming in the formation of the indium layer is that indium metal layers typically have large grains that are separated from each other resulting in an undesirably rough surface morphology. This is often thought to be due to the high-surface tension and low-melting temperature of indium due to its poor wettability. The undesirably rough surface morphology includes hillocks and reduces the efficiency of the absorber layer in producing electrical current from the photons in sunlight.

Various different sputtering conditions have been attempted to improve the surface morphology, i.e. reduce the surface roughness, of the indium layer. These previous attempts were not successful in improving the surface morphology and typically were time consuming and resulted in lower throughput.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION OF EMBODIMENTS OF THE DISCLOSURE

The disclosure provides an innovative method that includes providing an indium sputtering target that also includes aluminum or other suitable metals. The sputtering target is used to sputter a layer of a metallic precursor on a solar cell substrate. The metallic precursor layer is advantageously combined with other metallic precursor materials and thermally treated to form a chalcopyrite-based absorber layer for a solar cell. The inclusion of aluminum or other metallic material in the indium target provides various advantages such as a chalcopyrite-based solar cell with enhanced efficiency due to a smoother morphology of the indium-containing layer and improved compositional uniformity of the indium-containing metal precursor layer. In some embodiments, the amount of aluminum or other added metal is controlled to form an absorber layer with a double graded chalcopyrite-based bandgap.

Figure 1:
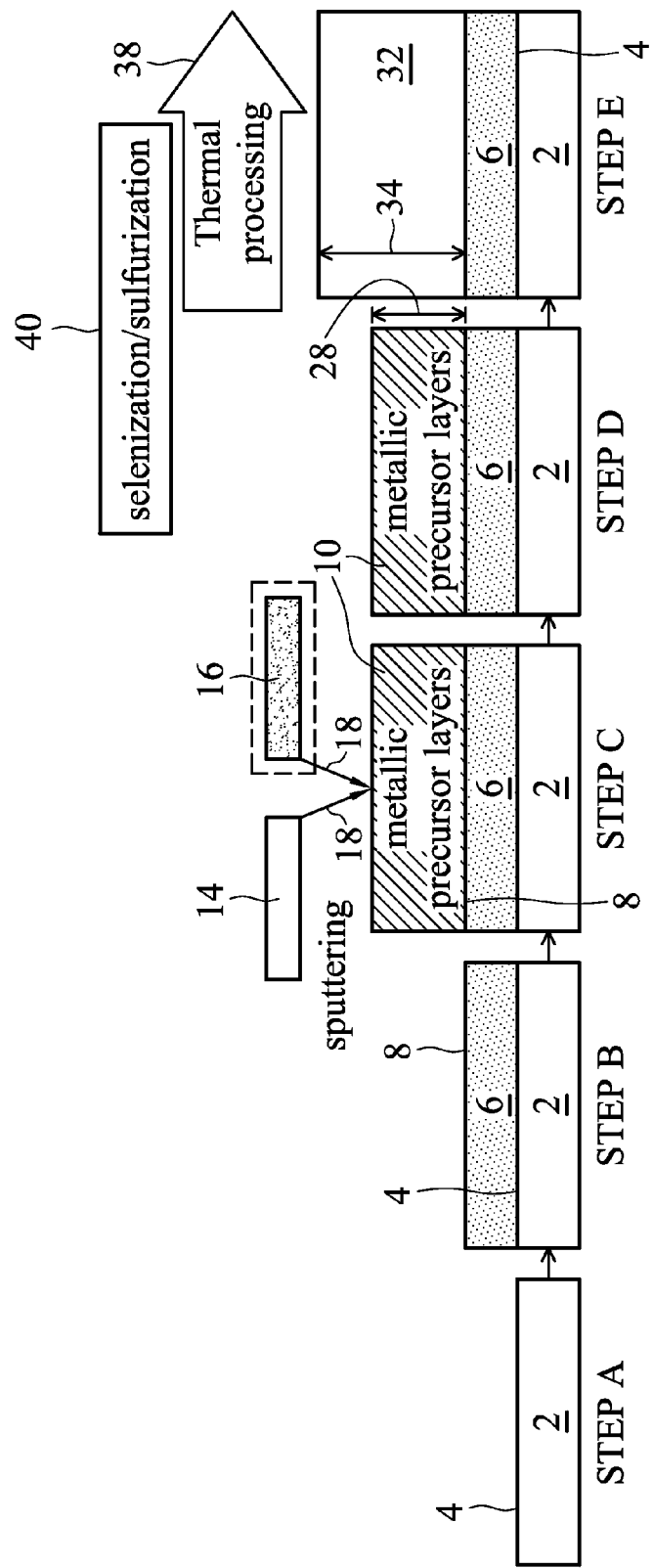
FIG. 1 illustrates a sequence of processing operations used to form a solar cell according to the disclosure and include multiple cross-sectional views.

FIG. 1 shows a sequence of processing operations that includes step A through step E. For each step, a cross-sectional view of the solar cell substructure is provided. Step A of FIG. 1 shows substrate 2 with upper surface 4. In one embodiment, substrate 2 is a glass substrate and in one particular embodiment substrate is a soda lime gas substrate but other suitable substrates used in the solar cell manufacturing industry, are used in other embodiments. Step B shows back contact layer 6 disposed directly on upper surface 4 but in other embodiments, an additional film layer or layers is formed over upper surface 4 and therefore interposed between substrate 2 and back contact layer 6. In some embodiments, a barrier layer, not shown, is interposed between substrate 2 and back contact layer 6 and in other embodiments a silicon layer, an oxide layer, or both are interposed between substrate 2 and back contact layer 6. Back contract layer 6 is formed of molybdenum, Mo, in some embodiments but other suitable materials are used in other embodiments. Back contact layer 6 includes top surface 8.

Step C of FIG. 1 shows metallic precursor layers 10 formed over back contact layer 6. Step C also shows metallic precursor layers 10 formed from CuGa material 14 and indium-based material 16 and. According to one embodiment, each of CuGa material 14 and indium-based material 16 is a sputtering target and arrows 18 represent materials sputtered from CuGa material 14 and from indium-based material 16 onto substrate 2 and, more particularly, onto top surface 8 of back contact layer 6. In one embodiment, the material from CuGa material 14 is sputtered first to form one metal precursor layer and the material from indium-based material 16 is next sputtered to form an indium-containing metal precursor layer. In another embodiment, the materials from CuGa material 14 and indium-based material 16 are sputtered simultaneously, or on an alternating basis.

In one embodiment, CuGa material 14 is about 25 atomic percent gallium but other material compositions are used in other embodiments. Various suitable sputtering conditions are used to sputter the copper and gallium from CuGa material 14 and onto back contact layer 6.

Indium-based material 16 is advantageously a unitary sputtering target in some embodiments. In one embodiment, indium-based material 16 is an indium-aluminum target. In some embodiments, the target is formed by doping an indium target with aluminum. In one embodiment, indium-based material 16 is an indium-aluminum target that includes aluminum at 1 atomic percent. In other embodiments, indium-based material 16 is an indium-aluminum target that includes aluminum in an atomic percentage ranging from about 0.05 atomic percent to about 30 atomic percent. In other embodiments, indium-based material 16 includes indium in combination with one or more of zinc, chromium, nickel and tantalum, or indium in combination with other suitable metal materials. The composition of the indium-based material 16 includes the presence of the non-indium additive material at an atomic percentage ranging from about 0.05 to 30 atomic percent in the various embodiments. Once deposited, the indium-based metal precursor layer includes a smooth surface morphology, a substantial uniform composition, and is essentially free of hillocks.

In another embodiment, indium-based material 16 represents materials from two separate sources, e.g. two separate targets. According to this embodiment, there is one indium target and one further target formed of aluminum, zinc, chromium, nickel or tantalum or other suitable materials or combinations thereof. According to this embodiment, a film from the further target is first sputtered onto back contact layer 6 or onto a previously formed metallic precursor layer as an interlayer. This sputter deposition procedure is then followed by sputter deposition of indium. The presence of the pre-deposited thin film of aluminum, zinc, chromium, nickel, or other material, decreases the roughness of the subsequently deposited indium film.

Figure 2:
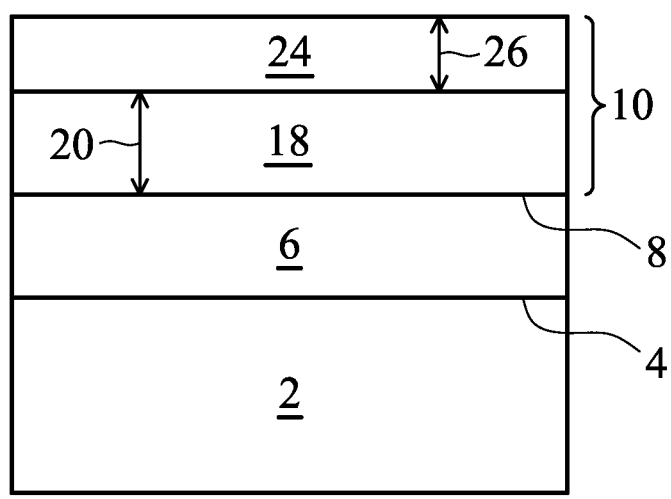
FIG. 2 is a cross-sectional view showing further details of one of the cross-sections of FIG. 1.

As above, metal precursor layers 10 represent a plurality of individual precursor layers in various embodiments. FIG. 2 is an embodiment of one such structure. FIG. 2 shows substrate 2 and back contact layer 6 formed over upper surface 4. In the embodiment of FIG. 2, metal precursor layers 10 include two layers but in other embodiments, different numbers of metal precursor layers are used. In FIG. 2, lower metal precursor layer 18 is a CuGa metal precursor layer with 25 atomic percent gallium in one embodiment but other materials are used in other embodiments. In one embodiment, lower metal precursor layer 18 includes thickness 20 of about 500 nm but other thicknesses that range from about 100-2000 nm are used in other embodiments. Upper metal precursor layer 24 may be an indium-based material layer and is indium-aluminum in one embodiment. In other embodiments, the indium-based layer, i.e. upper metal precursor layer 24, includes indium and one of the other previously listed metal materials. In one embodiment, upper metal precursor layer 24 includes thickness 26 of about 100 nm but other thicknesses within the range of 50 nm to about 1000 nm are used in other embodiments. It should also be noted that other embodiments include additional layers in addition to lower metal precursor layer 18 and upper metal precursor layer 24. In one previously described embodiment, upper metal precursor layer 24 is an indium layer and a thin film of a metal such as aluminum, zinc, chromium, nickel or tantalum, is interposed between lower metal precursor layer 18 and upper metal precursor layer 24.

Now returning to FIG. 1, step D shows metal precursor layers 10 with aggregate thickness 28 which ranges from about 100 nm to about 3000 nm in various embodiments. With metal precursor layers 10 in place, a thermal processing operation is carried out to convert metal precursor layers 10 to an absorber layer.

Step E represents the thermal processing operation taking place and shows absorber layer 32 formed from metal precursor layers 10. The thermal processing operation 38 includes a wide range of temperatures and utilizes temperatures within the range of about 400° C. to about 600° C. in some embodiments, but a wider range of temperatures are used in other embodiments. The time of the thermal processing operation ranges from about 15 minutes to several hours in various embodiments. In one embodiment, the thermal processing operation 38 is a selenization operation 40. In one such selenization embodiment, a selenium source is heated to drive selenium into the metal precursor layers being converted into absorber layer 32. The selenium source may be $H_2Se$ gas or other gas or a solid and various other techniques are used under various thermal conditions to drive the selenium into the metallic precursor layers 10 to form absorber layer 32. In some embodiments, absorber layer 32 is a CIGS-based material. CIGS material contains copper, indium, gallium, and selenium and is a tetrahedrally bonded semiconductor with a chalcopyrite crystal structure. In some embodiments, the CIGS-based material is stoichiometric copper indium gallium selenide but in other embodiments the CIGS-based absorber layer 32 is a non-stoichiometric composition. CIGS-based absorber layer 32 is a solid solution of copper indium selenide and copper gallium selenide described as $Cu(In,Ga)Se_2$ in some embodiments. In some embodiments, the selenization process is followed by a sulfurization process in which $H_2S$ gas or another sulfur source is used in conjunction with or following the selenization process to adjust the bandgap of the absorber layer as produced.

In some embodiments, absorber layer 32 is a CIGAS material, i.e. a material including copper, indium, gallium, aluminum and selenium. The CIGAS embodiment includes both gallium and aluminum. In other embodiments, a CIAS (copper, indium, aluminum, selenium) material is formed. In some embodiments, absorber layer 32 is a solid solution of copper indium selenide, copper gallium selenide and copper aluminum selenide and may be described as $Cu(In,Ga)Se_2$. The substitution of gallium by aluminum produces an absorber layer 32 with a desirable bandgap. In some embodiments, the amount of aluminum in the CIGAS is desirably less than the amount of gallium. In one embodiment, the CIGAS material is represented by $CuIn_{(1-x-y)}Ga_xAl_ySe_2$. In some embodiments, y<x and x lies within a range of about 0.2 to 0.35 but other compositions are used in other embodiments. The bandgap can be controlled by controlling the composition of the CIGAS absorber layer 32. In some embodiments, the CIGAS absorber layer 32 is formed to include a double graded chalcopyrite-based bandgap due to the presence of CIAS materials and CIGS materials as well as intermediary compositions. The bandgap may vary through the absorber layer 32 and be highest at the edges of the layer with a double gradient and have a bandgap minimum at an internal location. The double grading of the CIGS or CIGAS absorber layer improves the open-circuit voltage $V_{oc}$, without significantly sacrificing the short-circuit current $J_{sc}$, compared to a uniform bandgap CIGS absorber layer. Double grading provides for increased performance by achieving a relatively high $J_{sc}$, which is determined by the minimum bandgap in the device, and at the same time, increased $V_{oc}$ is achieved due to a locally increased bandgap in the space charge region. In one embodiment, the double gradient is formed by sputtering CuGa on a bottom portion and In—Al on a top portion of metal precursor layer 10. According to one embodiment, the deposition is carried out in a manner to produce the desired compositional grading distribution with a v-shaped profile for metallic precursor layer 10. In one embodiment, both the bandgap profile and the aluminum concentration profile include this compositional grading distribution. In some embodiments, a CuGa target is used in conjunction with an indium target that further includes Al, to provide the aluminum source to form a CIGAS absorber layer 32 that is produced with the described compositional and bandgap gradient distribution after the thermal processing operation that converts metallic precursor layers 10 to absorber layer 32. In some embodiments, the v-shaped profile is self-forming. Thickness 34 of absorber layer 32 ranges from about 0.5 to 2 or 3 micrometers in various embodiments.

Subsequent processing operations are then carried out to form a solar cell from the structure shown in step E of FIG. 1. In one embodiment, a CdS buffer layer is formed over absorber layer 32 and a window layer is formed over the CdS buffer layer, but other subsequent films are used in other embodiments. The CIGAS or other CIGS-based absorber layer provides high efficiency conversion of sunlight to electrical current.

Figure 3:
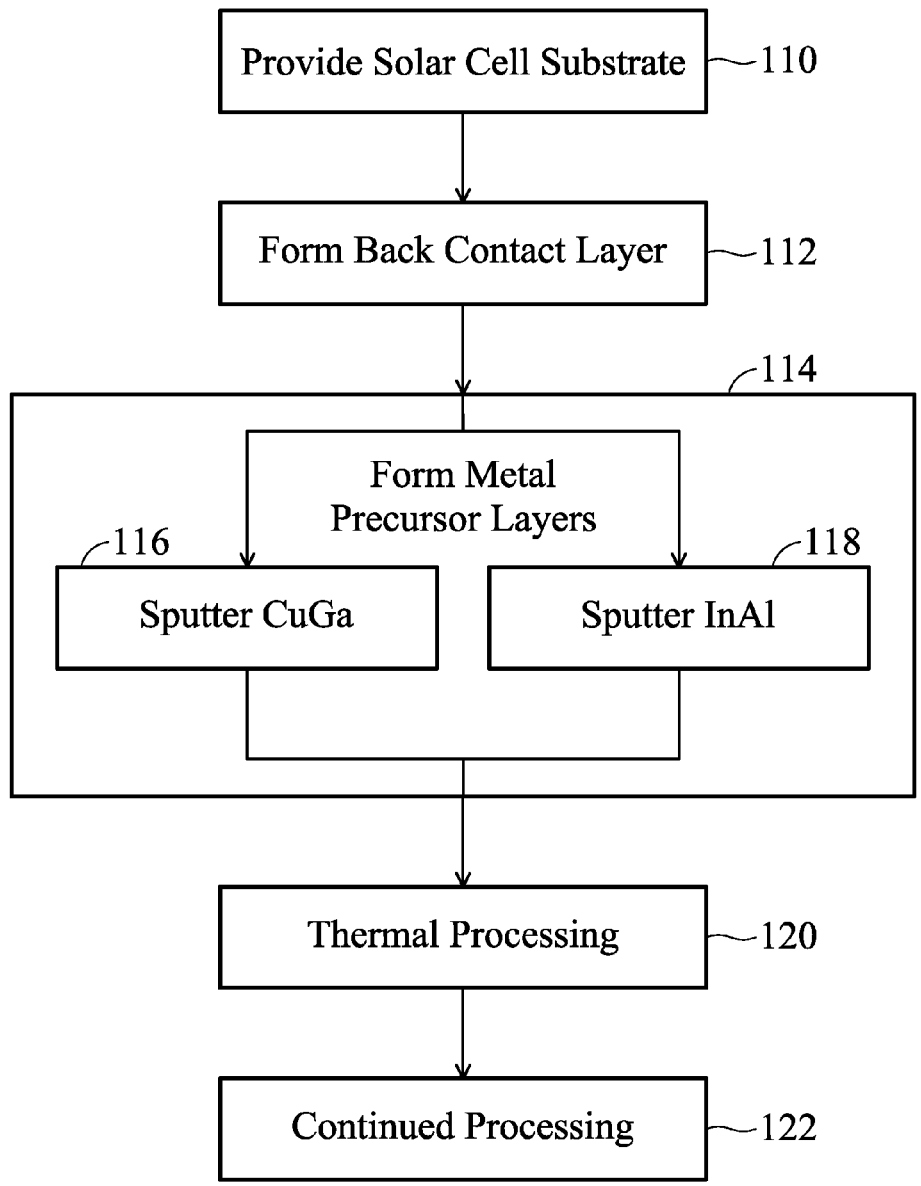
FIG. 3 is a flowchart showing a sequence of processing operations according to an embodiment of the disclosure.

FIG. 3 is a flowchart of an exemplary method for forming a solar cell according to the disclosure. At step 110, a solar cell substrate is provided and the solar cell substrate may have a layer or layers disposed on the substrate. At step 112, a back contact layer such as back contact layer 6 of FIG. 1, is formed on or over a solar cell substrate such as substrate 2. Step 114 represents the formation of metal precursor layers and involves one or several deposition operations. The deposition operations may take place in sequence or simultaneously. In the illustrated embodiment of FIG. 3, step 116 represents the sputtering of CuGa and step 118 represents sputtering of InAl and these steps may take place simultaneously or step 116 may take place prior to step 118 or they may be performed in an alternating manner. In other embodiments, different or additional metal precursor layer formation steps are used. For example, the In and Al may be sputter deposited separately. In one embodiment, the Al is sputter deposited prior to the sputter deposition of In. In still other embodiments (not illustrated in FIG. 3), other thin films such as zinc, chromium, nickel, tantalum or other suitable materials are pre-deposited as an interlayer within the metal precursor layer prior to the deposition of the In film and the use of this pre-deposition of Al, Zn, Cr, Ni, Ta or suitable materials, enhances the adhesion and decreases the roughness of the post-deposited In film. At step 120, thermal processing takes place and the thermal processing advantageously includes at least selenization. At step 122, continued processing takes place to form the completed solar cell.

According to one aspect, a method for forming a solar cell is provided. The method comprises providing an InAl target of indium and aluminum; providing a solar cell substrate with a back contact layer thereon; forming metallic precursor layers over the back contact layer including sputtering materials of the InAl target onto the solar cell substrate over the back contact layer and thermally processing thereby converting the metal precursor layers to an absorber layer.

According to another aspect, a method for forming a solar cell is provided. The method comprises: providing a target of indium and a further material selected from the group consisting of Al, Zn, Cr, Ni, and Ta; providing a substrate with a back contact layer thereon; forming metallic precursor layers over the back contact layer including sputtering materials of the target onto the substrate over the back contact layer; and thermally processing thereby converting the metal precursor layers to an absorber layer.

According to another embodiment, a solar cell is provided. The solar cell comprises an absorber layer disposed over a solar cell substrate. The absorber layer comprises a CIGAS (copper, indium, gallium, aluminum, selenium) material.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a solar cell, said method comprising:
   providing an InAl target of indium and aluminum;
   providing a solar cell substrate with a back contact layer thereon;
   forming metallic precursor layers over said back contact layer including sputtering materials of said InAl target onto said solar cell substrate over said back contact layer; and
   thermally processing thereby converting said metal precursor layers to an absorber layer.

2. The method as in claim 1, wherein said InAl target comprises about 0.05 to 30 atomic percentage of aluminum.

3. The method as in claim 1, wherein said InAl target comprises about 1 atomic percent of aluminum and said thermally processing includes a temperature within the range of about 400° C. to 600° C.

4. The method as in claim 1, wherein said forming metallic precursor layers further includes sputtering CuGa material from a CuGa target onto said solar cell substrate over said back contact layer, prior to said sputtering material of said InAl target.

5. The method as in claim 4, wherein said absorber layer comprises a CIGAS (copper-indium-gallium-aluminum-selenium) absorber layer.

6. The method as in claim 5, wherein said thermally processing includes a selenization process followed by a sulfurization process and produces said absorber layer being a chalcopyrite crystalline layer.

7. The method as in claim 6, wherein said sputtering materials of said InAl target produces an InAl film having a thickness of about 100 nm on said back contact layer and said CIGAS absorber layer includes a thickness of about 2-3 micrometers.

8. The method as in claim 1, wherein said back contact layer comprises molybdenum and further comprising forming a buffer layer between said back contact layer and said metallic precursor layers and forming a window layer over said absorber layer.

9. The method as in claim 1, wherein said thermally processing includes a selenization process that incorporates selenium into said absorber layer.

10. The method as in claim 9, wherein said thermally processing comprises said selenization process using $H_2Se$ gas as a selenium source and followed by a sulfurization process, said thermally processing causing said absorber layer to be a chalcopyrite crystalline material.

* * * * *